(12) United States Patent
Iijima et al.

(10) Patent No.: US 9,761,299 B2
(45) Date of Patent: *Sep. 12, 2017

(54) SEMICONDUCTOR INTEGRATED CIRCUIT CAPABLE OF PRECISELY ADJUSTING DELAY AMOUNT OF STROBE SIGNAL

(71) Applicant: RENESAS ELECTRONICS CORPORATION, Tokyo (JP)

(72) Inventors: Masaaki Iijima, Tokyo (JP); Mitsuhiro Deguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/360,404

(22) Filed: Nov. 23, 2016

(65) Prior Publication Data

US 2017/0076777 A1 Mar. 16, 2017

Related U.S. Application Data

(63) Continuation of application No. 14/369,501, filed as application No. PCT/JP2011/080532 on Dec. 29, 2011, now Pat. No. 9,536,579.

(51) Int. Cl.
*G11C 11/4076* (2006.01)
*H03K 19/00* (2006.01)
(Continued)

(52) U.S. Cl.
CPC ...... *G11C 11/4076* (2013.01); *G06F 13/1689* (2013.01); *G11C 7/1066* (2013.01);
(Continued)

(58) Field of Classification Search
None
See application file for complete search history.

(56) References Cited

U.S. PATENT DOCUMENTS 6,205,086 B1 3/2001 Hanzawa et al.
6,222,792 B1 4/2001 Hanzawa et al.
(Continued)

FOREIGN PATENT DOCUMENTS

JP 2000-311028 A 11/2000
JP 2000-323969 A 11/2000
(Continued)

OTHER PUBLICATIONS

International Search Report PCT/JP2011/080532 dated Jan. 31, 2012 (English translation).
(Continued)

*Primary Examiner* — J. H. Hur
(74) *Attorney, Agent, or Firm* — McDermott Will & Emery LLP

(57) ABSTRACT

An interface circuit provided in a semiconductor device supplies an operation clock to an external memory device based on a clock signal (CK) and receives a data signal (DQ) and a strobe signal (DQS) from the external memory device. The interface circuit includes a delay circuit delaying the received strobe signal (DQS). The delay circuit includes a first adjustment circuit and a second adjustment circuit connected in series with the first adjustment circuit. The first adjustment circuit is capable of adjusting a delay amount of the strobe signal (DQS) in a plurality of steps in accordance with the set frequency of the clock signal (CK). The second adjustment circuit is capable of adjusting the delay amount of the strobe signal (DQS) with a higher precision than the first adjustment circuit.

4 Claims, 17 Drawing Sheets

(51) Int. Cl.

| | |
|---|---|
| H03K 19/096 | (2006.01) |
| G11C 7/22 | (2006.01) |
| H03K 5/159 | (2006.01) |
| G06F 13/16 | (2006.01) |
| G11C 7/10 | (2006.01) |
| G11C 11/4093 | (2006.01) |
| G11C 29/02 | (2006.01) |

(52) U.S. Cl.
CPC ............ *G11C 7/1093* (2013.01); *G11C 7/222* (2013.01); *G11C 11/4093* (2013.01); *G11C 29/023* (2013.01); *G11C 29/028* (2013.01); *H03K 5/159* (2013.01); *H03K 19/0016* (2013.01); *H03K 19/096* (2013.01)

(56) References Cited

U.S. PATENT DOCUMENTS

| | | | |
|---|---|---|---|
| 9,536,579 B2* | 1/2017 | Iijima | ................ H03K 19/0016 |
| 2002/0149967 A1 | 10/2002 | Borkenhagen et al. | |
| 2003/0070052 A1 | 4/2003 | Lai | |
| 2005/0047192 A1 | 3/2005 | Matsui et al. | |
| 2008/0276112 A1 | 11/2008 | Matsui et al. | |
| 2009/0039930 A1 | 2/2009 | Kuroki et al. | |
| 2012/0194248 A1 | 8/2012 | Magee et al. | |

FOREIGN PATENT DOCUMENTS

| | | | |
|---|---|---|---|
| JP | 2005-078547 A | 3/2005 |
| JP | 2006-099244 A | 4/2006 |
| JP | 2007-226308 A | 9/2007 |
| JP | 2008-311999 A | 12/2008 |
| JP | 2009-021706 A | 1/2009 |
| JP | 2009-212735 A | 9/2009 |
| JP | 2011-188042 A | 9/2011 |

OTHER PUBLICATIONS

Japanese Office Action dated Sep. 29, 2015, issued in corresponding Japanese Patent Application No. 2013-551167. (w/ English translation).
Taiwanese Office Action dated Jan. 29, 2016 issued in Taiwanese Patent Application No. 101147529 (English translation).
Chinese Office Action dated May 3, 2016 issued in Chinese Patent Application No. 201180076035.8 (English translation).
Taiwanese Office Action dated Sep. 9, 2016 issued in Taiwanese Patent Application No. 101147529 (English translation).
U.S. Notice of Allowance dated Oct. 21, 2016 issued in U.S. Appl. No. 14/369,501.
U.S. Final Office Action dated Apr. 28, 2016 issued in U.S. Appl. No. 14/369,501.
U.S. Office Action dated Oct. 22, 2015 issued in U.S. Appl. No. 14/369,501.
Taiwanese Office Action dated Jul. 19, 2017 issued in Taiwanese Patent Application No. 106102800 (with English translation).

* cited by examiner

FIG.7

| BIT RATE (OPERATION FREQUENCY) f | OFFSET SETTING VALUE |
|---|---|
| f ≦ 266Mbps | 3 |
| 266Mbps < f ≦ 333Mbps | 2 |
| 333Mpbs < f ≦ 400Mbps | 1 |
| 400Mbps < f ≦ 533Mbps | 0 |

FIG.15

| BIT RATE (OPERATION FREQUENCY) f | OFFSET SETTING VALUE |
|---|---|
| f ≦ 200Mbps | 3 |
| 200Mbps < f ≦ 266Mbps | 2 |
| 266Mpbs < f ≦ 333Mbps | 1 |
| 333Mbps < f ≦ 800Mbps | 0 |

SEMICONDUCTOR INTEGRATED CIRCUIT CAPABLE OF PRECISELY ADJUSTING DELAY AMOUNT OF STROBE SIGNAL

CROSS-REFERENCE TO RELATED APPLICATIONS

This application is the Continuation application of U.S. patent application Ser. No. 14/369,501, filed Jun. 27, 2014 which is the U.S. National Phase of International Patent Application No. PCT/JP2011/080532, filed Dec. 29, 2011 the subject matter of which is incorporated herein by reference in their entireties.

TECHNICAL FIELD

The present invention relates to a semiconductor device including an interface circuit to/from which data is input/output from/to a memory device, and particularly relates to a semiconductor device to/from which data is input/output from/to a double data rate (DDR) synchronous memory.

BACKGROUND ART

As a synchronous memory to/from which data is input/output at a double data rate, a DDR-SDRAM (Synchronous Dynamic Random Access Memory) for example is known. For the purpose of high-speed clock synchronous communication, the DDR-SDRAM outputs a data signal and a strobe signal synchronized with the data signal. The data signal and the strobe signal which are output from the DDR-SDRAM have respective edges that coincide with each other.

In the interface circuit receiving the data signal and the strobe signal which are output from the DDR-SDRAM, a delay circuit is necessary that delays the received strobe signal by a ¼ period. Delay of the input strobe signal by a ¼ period (corresponding to a phase of 90 degrees) enables the data signal to be taken at both the rising edge and the falling edge of the strobe signal.

As a circuit for adjusting the amount of delay of the strobe signal, a circuit disclosed in Japanese Patent Laying-Open No. 2008-311999 (PTD 1) for example is known. This circuit includes a variable delay unit providing a variable amount of delay, a phase comparison unit, and a delay control unit. The phase comparison unit compares the phase of the strobe signal given from an input buffer gate with the phase of a delay signal given from the variable delay unit. Based on the result of comparison by the phase comparison unit, the delay control unit sets the amount of delay of the variable delay unit.

An operation clock of the DDR-SDRAM is supplied as an external clock from the aforementioned interface circuit. Input/output of data to/from the DDR-SDRAM is synchronized with the external clock. Therefore, the DDR-SDRAM is provided with a regeneration circuit for regenerating an internal clock that is correctly synchronized with the external clock. As such a regeneration circuit, a PLL (Phase Lock Loop) circuit (see for example Japanese Patent Laying-Open No. 2000-323969 (PTD 2)), or a DLL (Delay Lock Loop) circuit (see for example Japanese Patent Laying-Open No. 2009-21706 (PTD 3)), or an SMD (Synchronous Mirror Delay) circuit (see for example Japanese Patent Laying-Open No. 2000-311028 (PTD 4)) is used, for example.

CITATION LIST

Patent Document

PTD 1: Japanese Patent Laying-Open No. 2008-311999
PTD 2: Japanese Patent Laying-Open No. 2000-323969
PTD 3: Japanese Patent Laying-Open No. 2009-21706
PTD 4: Japanese Patent Laying-Open No. 2000-311028

SUMMARY OF INVENTION

Technical Problem

It is necessary for the delay circuit provided in the interface circuit to make the delay amount of the delay circuit correctly identical to a target delay which is determined in accordance with the frequency of the strobe signal, namely the operation frequency of the memory device. Particularly in recent memory devices, the operation frequency of the memory device may be changed for use in order to reduce power consumption. Therefore, the delay amount must be adjusted for a wider frequency range than the conventional one.

The delay circuit is usually made up of many cascade-connected delay elements (inverters for example). The delay amount of the strobe signal is adjusted by changing the number of stages of delay elements through which the strobe signal is passed. Therefore, for accommodation to a wider frequency range, an increase of the number of delay elements has conventionally been unavoidable, which leads to an increase of the area occupied by the delay circuit.

Meanwhile, if the delay amount of each delay element is simply increased, an error relative to a target delay which is determined in accordance with the operation frequency of the memory device increases, resulting in a problem of a reduced margin of a setup time or hold time when data is read from the memory device.

An object of the present invention is to provide a semiconductor device including an interface circuit which receives a data signal and a strobe signal from a memory device, in such a manner that makes the delay amount correctly adjustable for a wider frequency range while reducing area penalty.

Solution to Problem

A semiconductor device according to an embodiment of the present invention includes a clock generator generating a clock signal having a set frequency, and an interface circuit. The interface circuit supplies an operation clock to an external memory device based on the clock signal, and receives a data signal and a strobe signal from the external memory device. The interface circuit includes a delay circuit delaying the received strobe signal, and a data detection circuit sampling the data signal at a timing of an edge of the delayed strobe signal. The delay circuit includes a first adjustment circuit and a second adjustment circuit connected in series with the first adjustment circuit. The first adjustment circuit is capable of adjusting a delay amount of the strobe signal in a plurality of steps in accordance with the set frequency of the clock signal. The second adjustment circuit is capable of adjusting the delay amount of the strobe signal with a higher precision than the first adjustment circuit.

Advantageous Effects of Invention

In accordance with the above-described embodiment, the delay circuit for delaying the strobe signal includes the first adjustment circuit and the second adjustment circuit capable of making adjustment with a higher precision than the first adjustment circuit. The delay amount of the first adjustment circuit is adjusted in a plurality of steps in accordance with the set frequency of the clock signal. Therefore, the delay amount can accurately be adjusted for a wider frequency range while reducing area penalty.

BRIEF DESCRIPTION OF DRAWINGS

FIG. 7 is a diagram showing an example conversion table stored in a memory controller 4 in FIG. 1.

FIG. 15 is a diagram showing an example conversion table stored in memory controller 4 for offset adjustment circuit 26A in FIG. 14.

DESCRIPTION OF EMBODIMENTS

Figure 1:
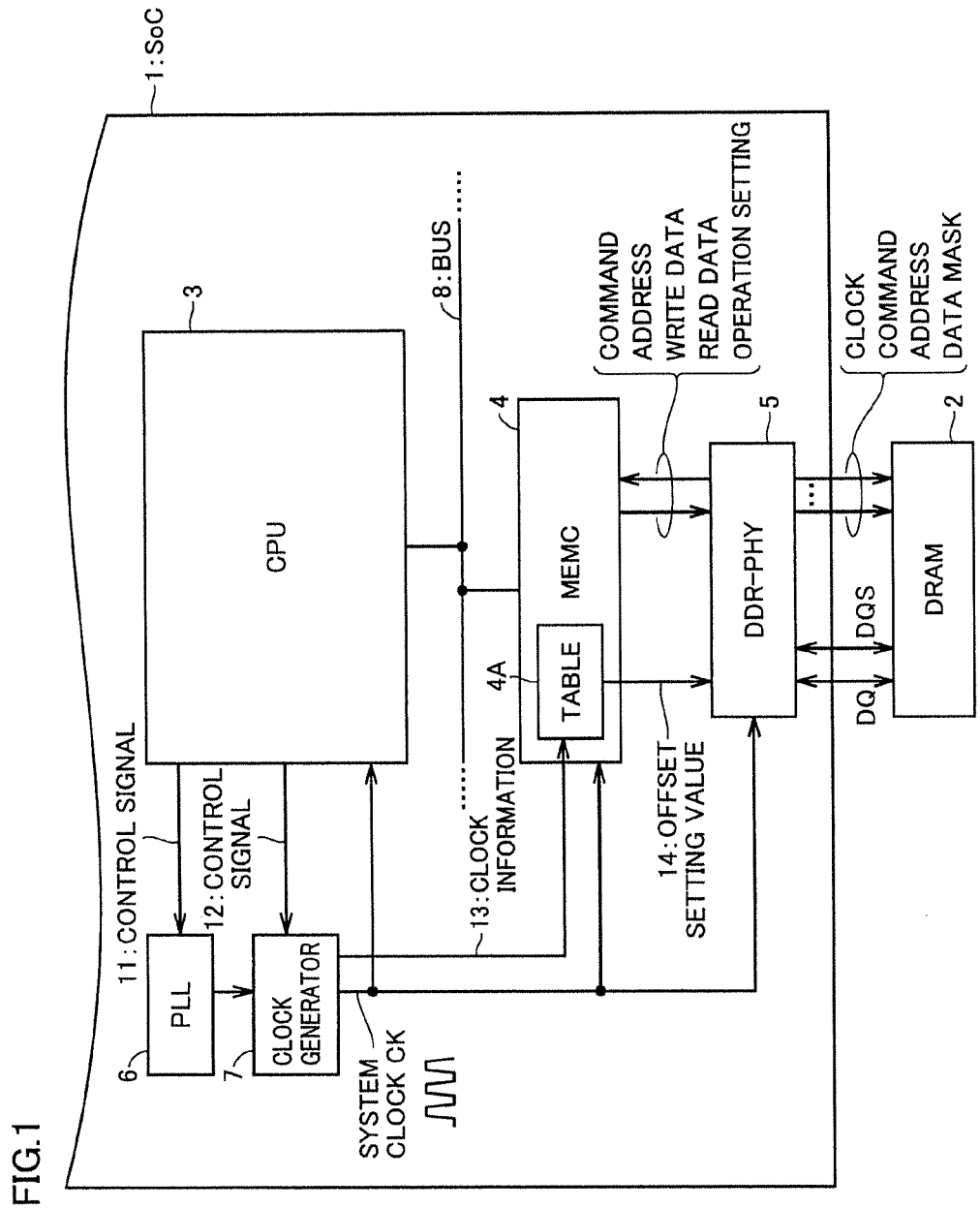
FIG. 1 is a block diagram showing a configuration of a semiconductor device 1 according to a first embodiment of the present invention.

In the following, embodiments of the present invention will be described in detail with reference to the drawings. The same or corresponding parts are denoted by the same reference characters, and a description thereof will not be repeated.

First Embodiment

[Overall Configuration of Semiconductor Device 1]

FIG. 1 is a block diagram showing a configuration of a semiconductor device 1 according to a first embodiment of the present invention. Referring to FIG. 1, semiconductor device 1 is configured in the form of SoC (System on Chip) where many functional blocks are integrated onto a semiconductor substrate. Specifically, semiconductor device 1 includes a central processing unit (CPU) 3 controlling the whole semiconductor device, an interface circuit 5, a memory controller (MEMC) 4, a PLL circuit 6, and a clock generator 7, for example.

Interface circuit 5 is connected with an external DRAM (Dynamic Random Access Memory) device 2 (DDR-SDRAM). Interface circuit 5 is a physical interface (DDR-PHY) for accessing DRAM device 2 at a double data rate. Specifically, interface circuit 5 outputs, to DRAM device 2, a clock, various commands, address signals (row address, column address), and a data mask signal, for example.

Further, between interface circuit 5 and DRAM device 2, data signal DQ and strobe signal DQS are input/output to/from each other. When data is read from DRAM device 2 into interface circuit 5, DRAM device 2 outputs data signal DQ and strobe signal DQS with respective edges coincident with each other. In this case, interface circuit 5 delays the phase of strobe signal DQS by 90 degrees (¼ period) so that data is sampled at both the rising edge and the falling edge of strobe signal DQS. On the contrary, when data is written from interface circuit 5 into DRAM device 2, interface circuit 5 outputs strobe signal DQS to DRAM device 2 with the edge of strobe signal DQS located at the center of a data eye.

Memory controller 4 is connected to interface circuit 5 and also to CPU 3 through a bus 8. Memory controller 4 controls the operation of interface circuit 5 in accordance with instructions from CPU 3. Specifically, memory controller 4 outputs, to interface circuit 5, a command, an address, write data, and a signal for operation setting, for example, and receives read data from interface circuit 5. Memory controller 4 further outputs an offset setting value 14 to an offset adjustment circuit 26 (described later herein in connection with FIG. 2) provided in interface circuit 5.

PLL circuit 6 generates a reference clock, and clock generator 7 generates a system clock CK based on the reference clock which is output from PLL circuit 6. The operations of PLL circuit 6 and clock generator 7 are controlled by control signals 11, 12 from CPU 3. Accordingly, the frequency of system clock CK is set. The generated system clock CK is supplied to each part (such as CPU 3, memory controller 4, and interface circuit 5) of semiconductor device 1. Interface circuit 5 supplies an operation clock of DRAM device 2 based on system clock CK. Thus, the operation frequency of DRAM device 2 is determined in accordance with the set frequency of system clock CK.

Information regarding the set frequency of system clock CK (clock information) 13 is supplied from clock generator 7 to memory controller 4. In memory controller 4, a conversion table 4A is stored for converting the set frequency of system clock CK (operation frequency of DRAM device 2) into the offset setting value 14. Based on conversion table 4A, memory controller 4 determines the offset setting value 14 corresponding to the set frequency, and outputs the determined offset setting value 14 to offset adjustment circuit 26 in FIG. 2 provided in interface circuit 5.

[Configuration and General Operation of Interface Circuit 5]

Figure 2:
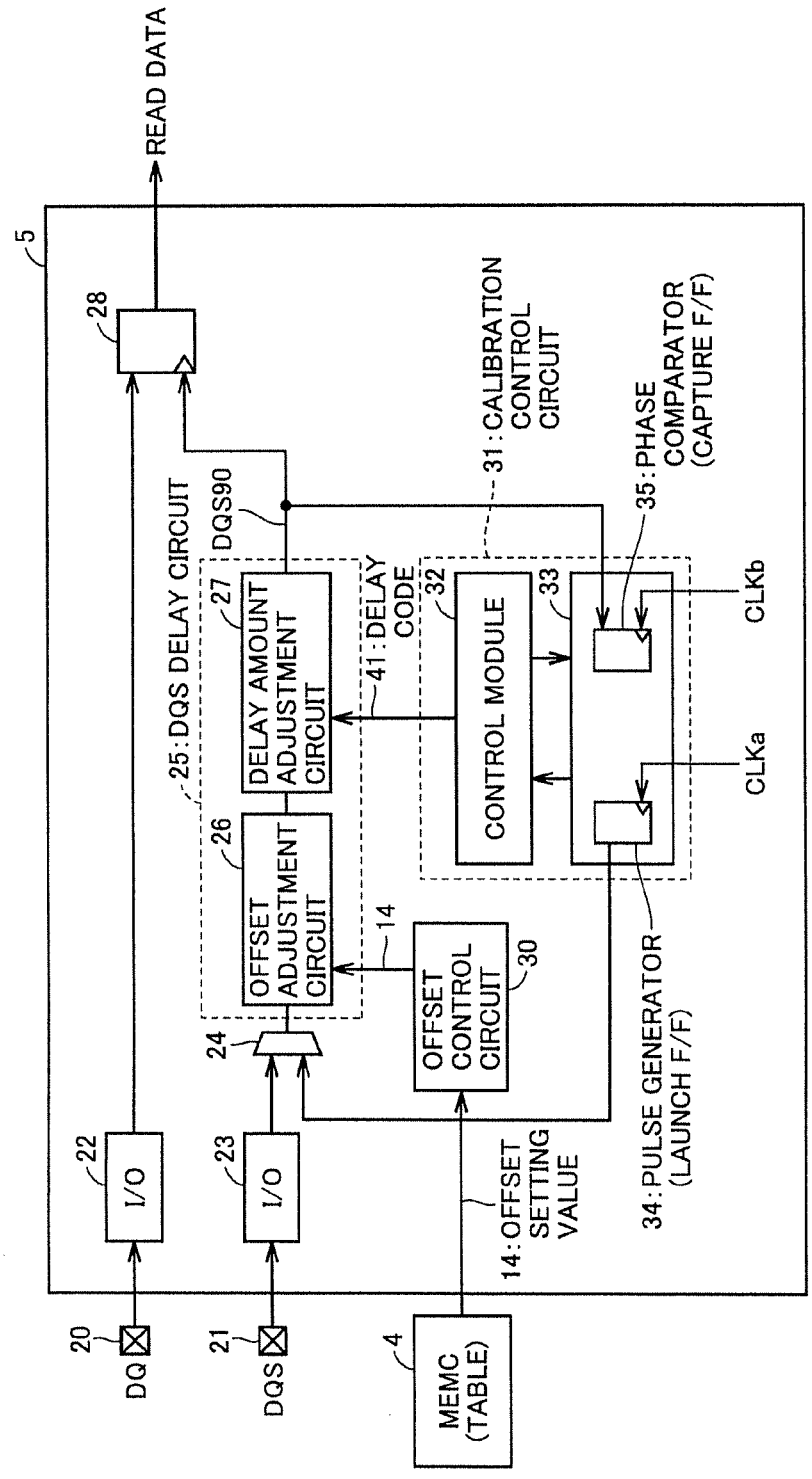
FIG. 2 is a block diagram showing a configuration of a part of an interface circuit 5 in FIG. 1.

FIG. 2 is a block diagram showing a part of the configuration of interface circuit 5 in FIG. 1. FIG. 2 shows the configuration of interface circuit 5 in FIG. 1, particularly the configuration relevant to reading of data from DRAM device 2. FIG. 2 further shows memory controller 4 in FIG. 1 as well as terminals 20 and 21 through which data signal DQ and strobe signal DQS are input/output, respectively.

Referring to FIG. 2, interface circuit 5 includes input/output (I/O) buffer amplifiers 22, 23, a selector circuit 24, a DQS delay circuit 25, a data detection circuit 28, an offset control circuit 30, and a calibration control circuit 31.

Data signal DQ which is input to terminal 20 from DRAM device 2 in FIG. 1 is input through buffer amplifier 22 to data detection circuit 28. Strobe signal DQS which is input to terminal 21 from DRAM device 2 is input through buffer amplifier 23 to selector circuit 24.

While interface circuit 5 performs a normal operation, selector circuit 24 selects strobe signal DQS which has been input through buffer amplifier 23 and outputs strobe signal DQS to DQS delay circuit 25 in the subsequent stage. In contrast, while interface circuit 5 performs a calibration operation, selector circuit 24 outputs a pulse signal which is output from calibration control circuit 31, to DQS delay circuit 25 in the subsequent stage.

The above-described operation modes (normal mode and calibration mode) of interface circuit 5 and the selecting operation of selector circuit 24 in accordance with the operation mode are controlled by memory controller 4. In the calibration mode, the delay amount of DQS delay circuit 25 is adjusted. In the normal mode, strobe signal DQS is delayed by the delay amount adjusted in the calibration mode.

DQS delay circuit 25 is provided for delaying the phase of strobe signal DQS by 90 degrees (¼ wavelength). DQS delay circuit 25 includes an offset adjustment circuit (first adjustment circuit) 26 and a delay amount adjustment circuit (second adjustment circuit) 27 connected in series to each other. Offset adjustment circuit 26 is capable of making a coarse adjustment, in multiple steps, of the delay amount of strobe signal DQS, in accordance with the offset setting value 14 (corresponding to the set frequency of system clock CK). Delay amount adjustment circuit 27 is capable of making a fine adjustment, with a higher precision than offset adjustment circuit 26, of the delay amount of strobe signal DQS, in accordance with a delay code 41 which is output from calibration control circuit 31. The order in which offset adjustment circuit 26 and delay amount adjustment circuit 27 are connected to each other may be reversed relative to that shown in FIG. 2, namely offset adjustment circuit 26 may be in the stage subsequent to delay amount adjustment circuit 27.

Data detection circuit 28 receives data signal DQ and strobe signal DQS90 having been delayed by DQS delay circuit 25. Data detection circuit 28 samples data signal DQ at both timings of the rising edge and the falling edge of strobe signal DQS90 having been delayed.

Figure 3:
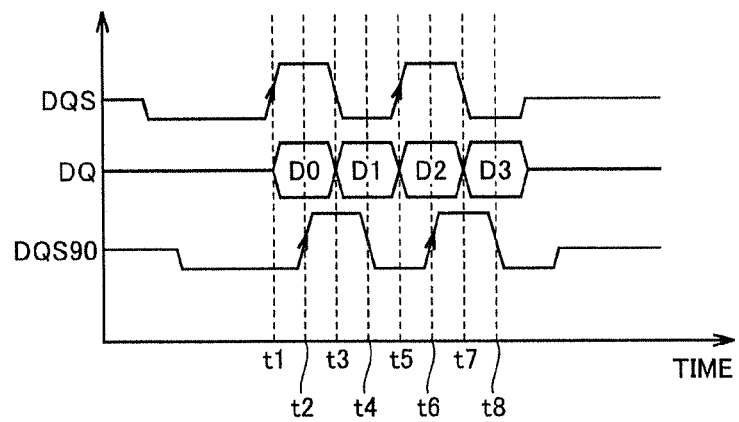
FIG. 3 is a diagram schematically showing respective waveforms of a strobe signal DQS, a data signal DQ, and a delayed strobe signal DQS90.

FIG. 3 is a diagram schematically showing respective waveforms of strobe signal DQS, data signal DQ, and strobe signal DQS90 which has been delayed.

Referring to FIGS. 2 and 3, data signal DQ which is input from DRAM device 2 in FIG. 1 has edges (time t1, t3, t5, t7) that coincide with the edges of strobe signal DQS. DQS delay circuit 25 delays strobe signal DQS90 by a ¼ period (a phase of 90 degrees). Data detection circuit 28 samples data signal DQ based on the delayed strobe signal DQS90 which is output from DQS delay circuit 25 in FIG. 2. Accordingly, data detection circuit 28 can take each of data D0, D1, D2, D3 at the central position (time t2, t4, t6, t8) of a data eye.

Referring again to FIG. 2, offset control circuit 30 outputs, to offset adjustment circuit 26, the offset setting value 14 corresponding to the set frequency of system clock CK. As described above, the correlation between the set frequency of system clock CK (the operation frequency of DRAM device 2 in FIG. 1) and the offset setting value 14 is stored in the form of conversion table 4A in memory controller 4. The offset setting value 14 based on conversion table 4A is input to offset adjustment circuit 26. The delay amount of offset adjustment circuit 26 is determined in accordance with the offset setting value 14.

After the delay amount of offset adjustment circuit 26 is set in accordance with the offset setting value 14, calibration control circuit 31 adjusts, in the calibration mode, the delay amount of delay amount adjustment circuit 27 so that the delay amount of DQS delay circuit 25 as a whole is identical to a target delay (specifically ¼ of the period corresponding to the operation frequency of DRAM device 2) which is determined in accordance with system clock CK.

Specifically, calibration control circuit 31 includes a signal processing unit 33 having a pulse generator 34 and a phase comparator 35, as well as a control module 32. Clock signal CLKa acts as a trigger to cause pulse generator 34 to generate one-shot pulse. Phase comparator 35 compares the phase of delayed pulse DQS90 resulting from the pulse which is output from pulse generator 34 and passes through DQS delay circuit 25, with the phase of clock signal CLKb.

Pulse generator 34 and phase comparator 35 can each be formed by a D flip-flop (F/F). A D flip-flop which forms pulse generator 34 is herein also referred to as launch flip flop (F/F), and a D flip-flop which forms phase comparator 35 is herein also referred to as capture flip-flop (F/F).

The phase of clock signal CLKb is adjusted so that it is delayed by 90 degrees relative to the phase of clock signal CLKa. Clock signals CLKa, CLKb may be supplied from clock generator 7 in FIG. 1 or generated by interface circuit 5 based on system clock CK. System clock CK may be used as clock signal CLKa.

In the calibration mode, control module 32 adjusts delay code 41 based on the result of comparison by phase comparator 35, so that the phase of delayed pulse DQS90 which is output from DQS delay circuit 25 and the phase of clock signal CLKb coincide with each other. Delay code 41 corresponds to the delay amount of delay amount adjustment circuit 27.

Figure 4:
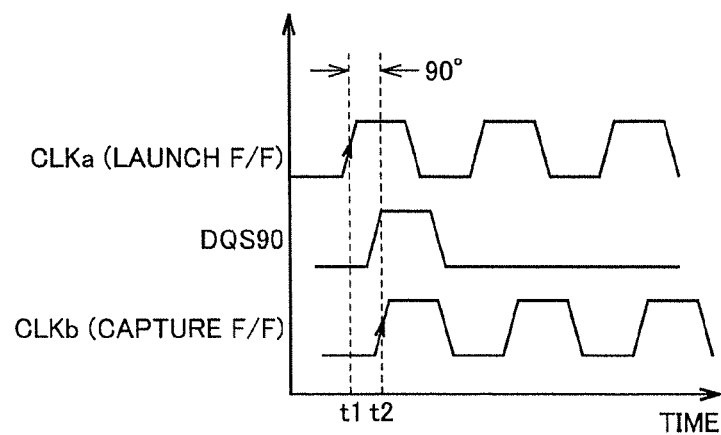
FIG. 4 is a diagram schematically showing respective waveforms of clock signals CLKa, CLKb and a delayed pulse DQS90.

FIG. 4 is a diagram schematically showing respective waveforms of clock signals CLKa, CLKb and delayed pulse DQS90.

Referring to FIGS. 2 and 4, the phase of clock signal CLKb is delayed by 90 degrees relative to the phase of clock signal CLKa. Namely, clock signal CLKb rises at t2 delayed by a phase of 90 degrees relative to time t1 at which clock signal CLKa rises.

The phase of the output pulse from pulse generator 34 coincides with the phase of clock signal CLKa. Meanwhile, the phase of delayed pulse DQS90 which is output from DQS delay circuit 25 is delayed, in accordance with delay code 41, relative to the output pulse from pulse generator 34.

Phase comparator 35 compares the phase of delayed pulse DQS90 with the phase of clock signal CLKb. In the case of FIG. 4, the output of phase comparator 35 is determined in accordance with the logic level of delayed pulse DQS90 at time t2. When the delay amount of delay amount adjustment circuit 27 is relatively small, the output of phase comparator 35 is high level (H level). In contrast, when the delay amount of delay amount adjustment circuit 27 is relatively large, the output of phase comparator 35 is low level (L level). Thus, switching of the output of phase comparator 35 from the H level to the L level or from the L level to the H level can be detected to determine whether or not the phase of delayed pulse DQS90 and the phase of clock signal CLKb coincide with each other.

Control module 32 utilizes switching of the logic level of the output of phase comparator 35 to determine delay code 41 by means of binary search. For example, when the delay amount of delay amount adjustment circuit 27 can be changed in 32 steps (5 bits), pulse generator 34 will output one-shot pulse five times before final delay code 41 is determined.

[Example Configuration of Delay Amount Adjustment Circuit 27]

Figure 5:
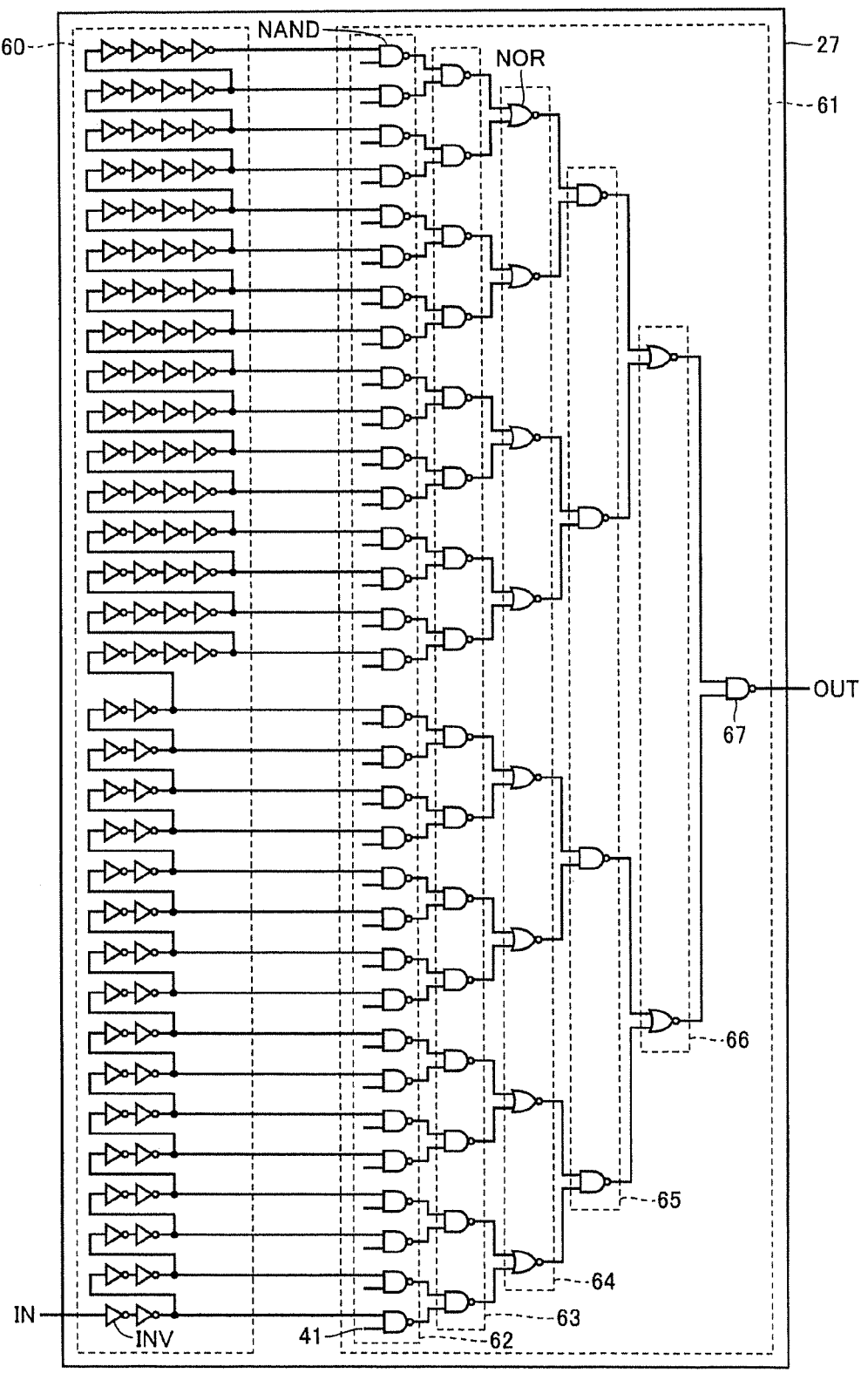
FIG. 5 is a diagram showing an example configuration of a delay amount adjustment circuit 27 in FIG. 2.

FIG. 5 is a diagram showing an example configuration of delay amount adjustment circuit 27 in FIG. 2. Referring to FIG. 5, delay amount adjustment circuit 27 includes a delay line 60 and a selector circuit 61. In FIG. 5, a signal is input to an input node IN, and the signal having been delayed is output from an output node OUT.

Delay line 60 includes a plurality of cascade-connected delay elements. In the example in FIG. 5, 96 inverters INV are included as a plurality of delay elements. These inverters INV are divided into 32 blocks each made up of two or four series-connected inverters. The signal can be output from each block.

Selector circuit 61 selects one of the 32 blocks in accordance with delay code 41, and outputs the signal provided from the selected block. In this way, the number of delay elements (inverters INV) through which strobe signal DQS passes after being input to and before being output from delay amount adjustment circuit 27 is changed.

Specifically, selector circuit 61 is made up of a plurality of logic gates (NAND gates and NOR gates) and includes first to fifth logic gate groups 62 to 66 arranged in hierarchy.

First logic gate group 62 is made up of 32 NAND gates associated respectively with the 32 blocks constituting delay line 60. To a first input terminal of each NAND gate, the signal from the associated block is input. To a second input terminal thereof, delay code 41 is input. Regarding delay code 41, only the signal which is input to the NAND gate associated with a selected block is "1" (H level), while the signals which are input to the NAND gates associated with the others, namely non-selected blocks are "0" (L level). In this respect, delay code 41 is different from the ordinary binary code. A decoder converting an ordinary binary code into delay code 41 is provided in control module 32 in FIG. 2.

The 32 NAND gates constituting first logic gate group 62 are grouped into groups each including two NAND gates, and these groups are connected respectively to 16 NAND gates constituting second logic gate group 63. Likewise, the 16 NAND gates constituting second logic gate group 63 are grouped into groups each including two NAND gates, and these groups are connected respectively to eight NOR gates constituting third logic gate group 64. The eight NOR gates constituting third logic gate group 64 are grouped into groups each including two NOR gates, and these groups are connected respectively to four NAND gates constituting fourth logic gate group 65. The four NAND gates constituting fourth logic gate group 65 are grouped into groups each including two NAND gates, and these groups are connected respectively to two NOR gates constituting fifth logic gate group 66. A NAND gate 67 provided in the last stage in selector circuit 61 is connected to the two NOR gates provided in fifth logic gate group 66.

[Example Configuration of Offset Adjustment Circuit 26]

Figure 6:
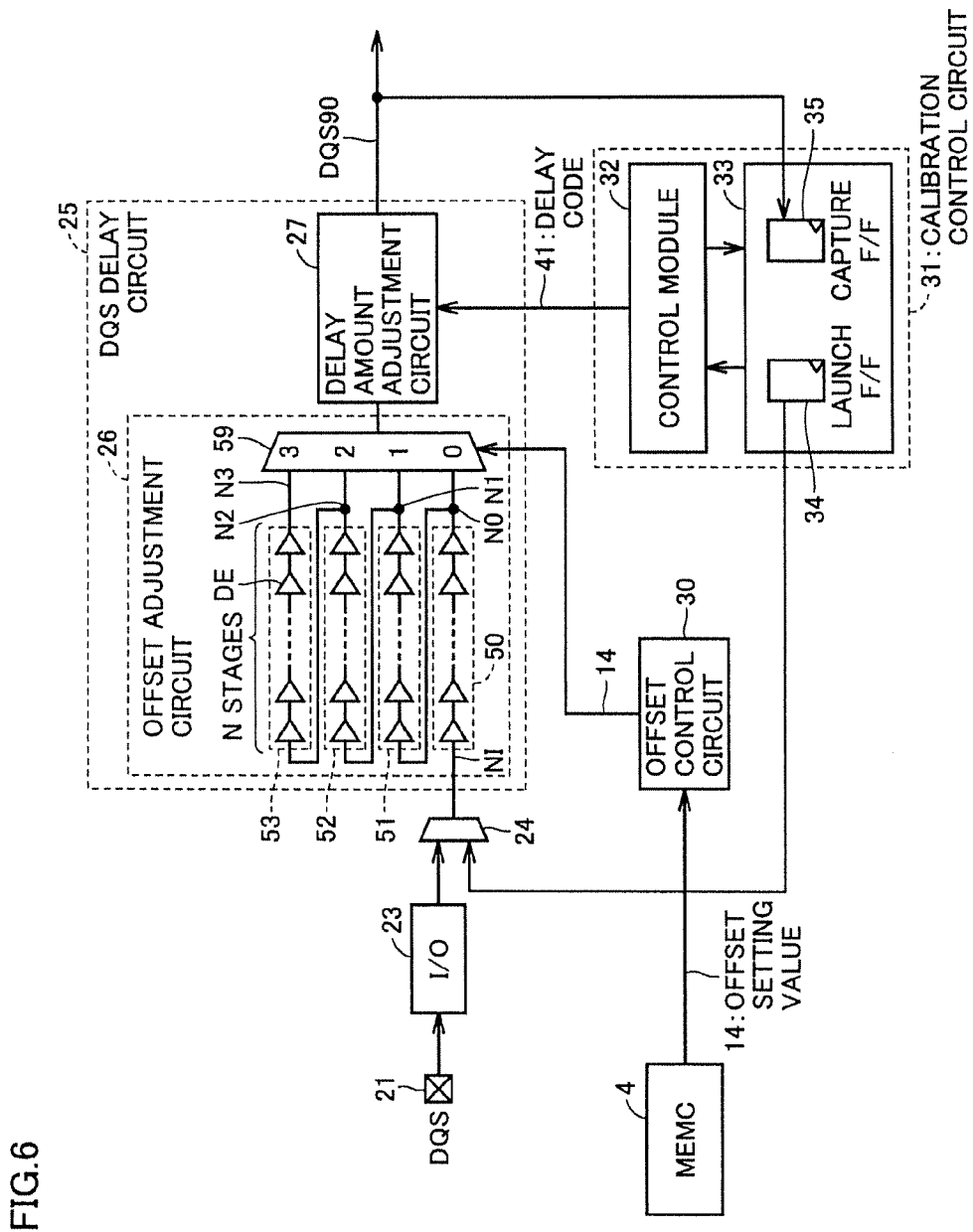
FIG. 6 is a diagram showing an example configuration of an offset adjustment circuit 26 in FIG. 2.

FIG. 6 is a diagram showing an example configuration of offset adjustment circuit 26 in FIG. 2. FIG. 6 also shows peripheral circuitry of offset adjustment circuit 26.

Referring to FIG. 6, offset adjustment circuit 26 includes a delay line, which is made up of a plurality of delay elements DE connected in series between an input node NI and an output node N3, and a selector circuit 59. These multiple delay elements DE are divided into M (M=4 in FIG. 6) blocks 50, 51, 52, 53. Each block includes N stages of delay elements DE connected in series to each other.

The threshold voltage of an MOS transistor forming each delay element DE provided in offset adjustment circuit 26 is set higher than the threshold voltage of an MOS transistor forming each delay element provided in delay amount adjustment circuit 27. In this way, with a smaller circuit area, the delay amount of each delay element DE provided in offset adjustment circuit 26 can be made larger than the delay amount of each delay element in delay amount adjustment circuit 27.

Selector circuit 59 selects one of connection nodes NO, N1, N2 and an output node N3 of blocks 50 to 53, and outputs a signal provided from the selected node. Specifically, in FIG. 6, selector circuit 59 outputs the signal of connection node NO when the offset setting value is 0. In this case, from offset adjustment circuit 26, strobe signal DQS having passed through block 50 is output. Likewise, selector circuit 59 outputs the signal of connection node N1 when the offset setting value is 1. In this case, from offset adjustment circuit 26, strobe signal DQS having passed through blocks 50, 51 is output. Selector circuit 59 outputs the signal of connection node N2 when the offset setting value is 2. In this case, from offset adjustment circuit 26, strobe signal DQS having passed through blocks 50, 51, 52 is output. Selector circuit 59 outputs the signal of output node N3 when the offset setting value is 3. In this case, from offset adjustment circuit 26, strobe signal DQS having passed through blocks 50, 51, 52, 53 is output. The specific configuration of selector circuit 59 is similar for example to the configuration of selector circuit 61 shown in FIG. 5.

In this way, in accordance with the offset setting value, selector circuit 59 can change the number of blocks (namely the number of delay elements) through which strobe signal DQS passes after being input to and before being output from offset adjustment circuit 26. The correlation between the set frequency and the offset setting value is determined so that the number of blocks through which strobe signal DQS passes before being output from offset adjustment circuit 26 is larger as the set frequency of system clock CK in FIG. 1 is lower.

FIG. 7 is a diagram showing an example conversion table stored in memory controller 4 in FIG. 1. In the example in FIG. 7, the offset setting value is defined in connection with the bit rate (equal to the operation frequency of the DRAM device) approximately from 266 Mbps to 533 Mbps. Namely, for this range of the operation frequency, the delay amount is adjustable.

The configuration of offset adjustment circuit 26 is not limited to the configuration shown in FIG. 6. For example, instead of selector circuit 59, another selector circuit may be disposed in the vicinity of input node NI, and this selector circuit may be used to change the passage of strobe signal DQS which has been input to input node NI. Thus, the order in which blocks 50 to 53 are arranged can be reversed relative to that in FIG. 5.

Taking the above into account, a more general description of the function of selector circuit 59 is given in the following. It is supposed that a plurality of delay elements DE provided in offset adjustment circuit 26 are divided into M blocks from the first block to the M-th block, and further supposed that i is an integer of 1 or more and M or less. Then, in accordance with the offset setting value, selector circuit 59 outputs strobe signal DQS having passed through none of M blocks or having passed through first to i-th blocks in order among the M blocks. In the case where the strobe signal passes through none of the M blocks, the delay amount of the strobe signal is set by delay amount adjustment circuit 27 only.

[Problem of Conventional DQS Delay Circuit]

Figure 8:
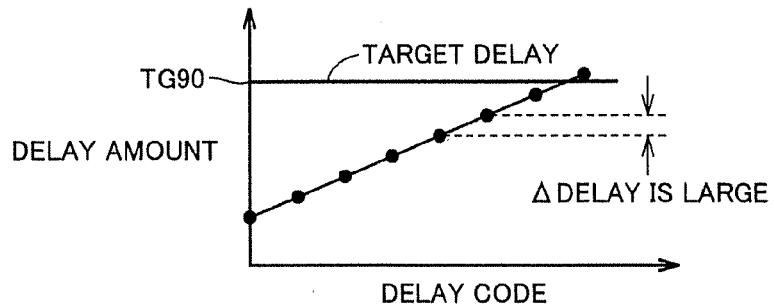
FIG. 8 is a diagram schematically showing a relationship between a delay code and a delay amount of a DQS delay circuit in a comparative example (in the case where the unit of change of the delay amount is relatively large).
Figure 9:
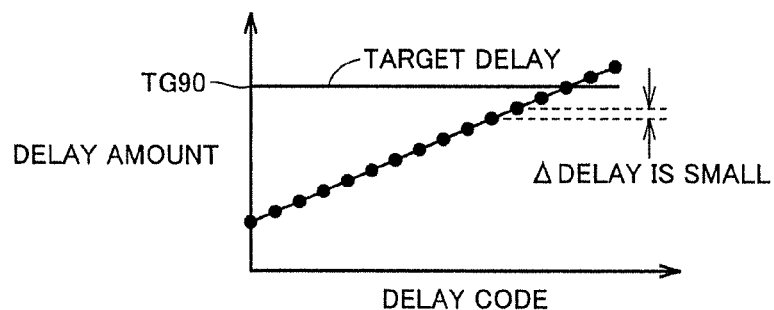
FIG. 9 is a diagram schematically showing a relationship between the delay code and the delay amount of the DQS delay circuit in a comparative example (in the case where the unit of change of the delay amount is relatively small).

Before a description of the effects of DQS delay circuit 25 having the configuration shown in FIG. 6 is given, a description of a problem of a conventional DQS delay circuit will be made. Referring to FIGS. 8 and 9, a case will now be described where offset adjustment circuit 26 for making a coarse adjustment of the delay amount is not provided.

Regarding the DRAM device, the operation frequency of the DRAM device may be changed for use in some cases for reducing power consumption. Specifically, if the maximum operation frequency is increased to thereby expand the frequency range, there arises the necessity to increase the number of delay elements constituting the delay line. For example, if the maximum rate of transfer to/from the DRAM device which has been 400 Mbps is to be changed to 533 Mbps, it becomes necessary to increase the number of steps in which the delay amount is changed by means of the delay line, from 32 steps to 64 steps or more. Accordingly, the circuit area is increased.

FIG. 8 is a diagram schematically showing a relationship between the delay code and the delay amount of a DQS delay circuit in a comparative example. In the example in FIG. 8, there is shown that the number of delay elements constituting the delay line and the number of steps in which the delay amount is changed (FIG. 8 shows that the number of steps is eight) are not changed while the delay amount of the unit delay element is made larger to thereby increase the unit of change (ΔDELAY) of the delay amount.

If the delay amount of the unit delay element which is a constituent element of the delay line is simply set large for the purpose of accommodation to a wider frequency range as shown in FIG. 8, an error relative to a target delay is increased. Accordingly, a problem arises such as a reduced margin of a setup time or a reduced margin of a hold time when data is read from the DRAM device, for example.

FIG. 9 is a diagram schematically showing a relationship between the delay code and the delay amount of the DQS delay circuit in a comparative example. In the example in FIG. 9, there is shown that the delay amount of the unit delay element is made smaller to thereby decrease the unit of change (ΔDELAY) of the delay amount.

In the case as shown in FIG. 9 where the delay amount of the unit delay element which is a constituent element of the delay line is small, it is unavoidable, for accommodation to a wider frequency range, an increase of the number of delay elements or an increase of the number of steps in which the delay amount is changed (16 steps in FIG. 9). Accordingly, the circuit area is undesirably increased. In particular, because the delay amount of the delay element varies depending on variation of the manufacturing conditions as well as the operation temperature and the operation voltage of the semiconductor device, a target delay amount may be difficult to attain in the case where the delay amount of the delay element is assumed to be smallest.

[Operation and Effects of DQS Delay Circuit 25 in the First Embodiment]

In the case of DQS delay circuit 25 shown in FIG. 6, accommodation to a wider range of the frequency is possible with the unit of change (ΔDELAY) of the delay amount kept small. Moreover, an increase of the circuit area can be suppressed.

Figure 10:
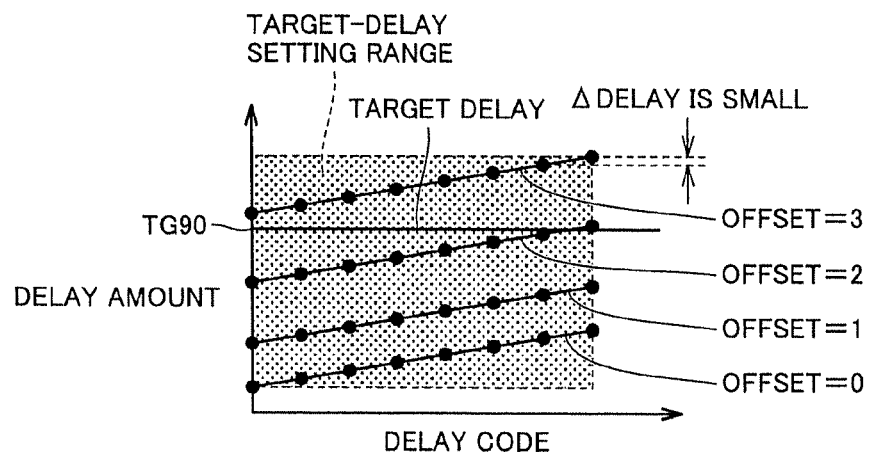
FIG. 10 is a diagram schematically showing a relationship between delay code 41 and the delay amount of a DQS delay circuit 25 in FIG. 6.

FIG. 10 is a diagram schematically showing a relationship between delay code 41 and the delay amount of DQS delay circuit 25 in FIG. 6. FIG. 10 illustrates the case where the configuration of delay amount adjustment circuit 27 in FIG. 6 is simplified as compared with the configuration shown as an example in FIG. 5. Namely, the delay amount of delay amount adjustment circuit 27 is adjustable in eight steps and respective units of change (ΔDELAY) of the delay amount for these steps are equal to each other.

As shown in FIG. 10, the offset setting value is changed (OFFSET=0 to 3 in the case of FIG. 10) so that the line representing the relationship between the delay amount and delay code 41 of DQS delay circuit 25 in FIG. 6 is shifted upward/downward with its slope maintained. In this way, the range in which a target delay TG90 is set can be expanded.

The delay amount of each delay element DE varies depending on variation of the manufacturing conditions of the semiconductor device as well as variation of the operation voltage and the operation temperature of the delay circuit. Offset adjustment circuit 26 should be designed taking this variation into account, and the number of stages N of delay elements DE provided in each of blocks 50 to 53 should be determined so that a delay amount appropriate for the operation frequency is obtained even when the delay amount of each delay element is smallest.

Figure 11:
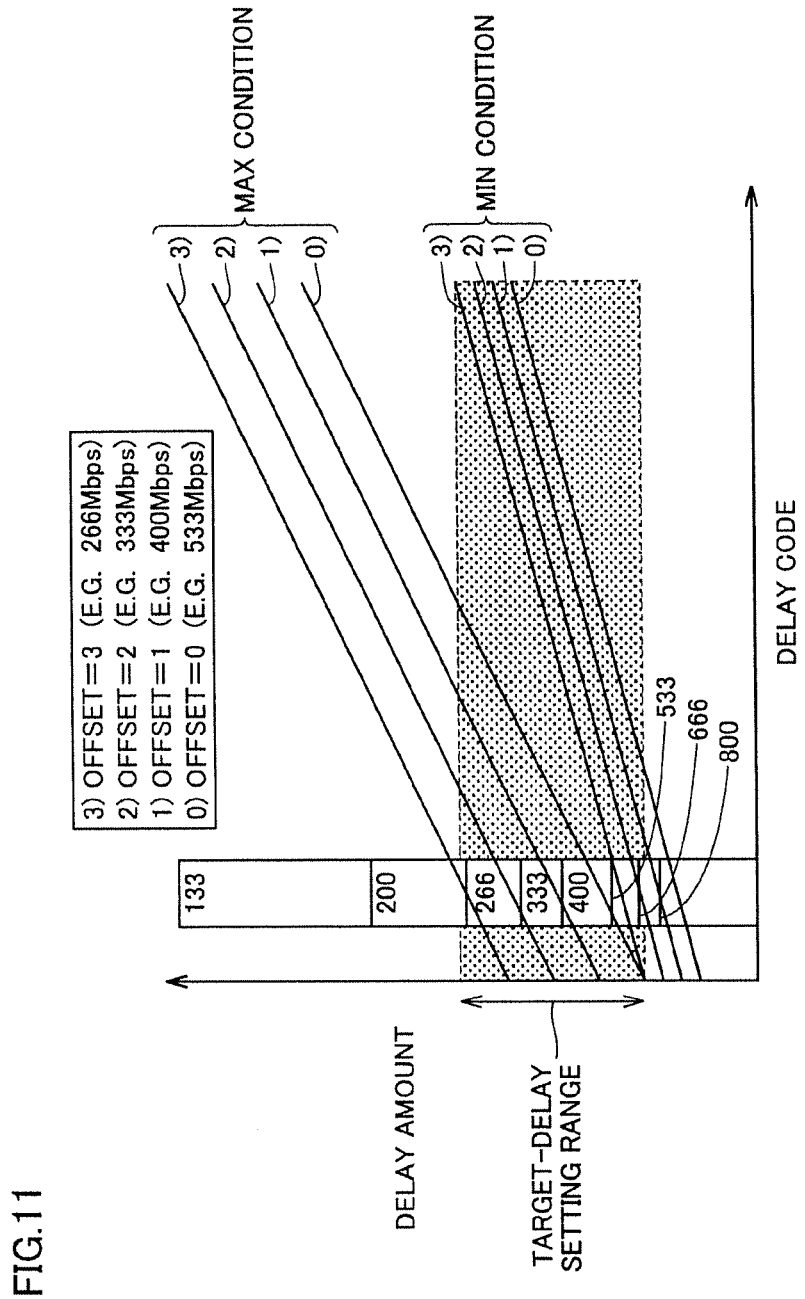
FIG. 11 is a diagram showing a relationship between the delay code and the delay amount of DQS delay circuit 25 in the case where the delay amount of each delay element DE is varied.

FIG. 11 is a diagram showing a relationship between the delay code and the delay amount of DQS delay circuit 25 in the case where the delay amount of each delay element DE is varied. In FIG. 11, the condition that the assumed delay amount of each delay element DE is minimum is referred to as MIN condition while the condition that the assumed delay amount of each delay element DE is maximum is referred to as MAX condition.

Referring to FIGS. 6 and 11, when the bit rate is 533 Mbps, the offset value (OFFSET) can be set to 0 to thereby set the delay amount of the whole DQS delay circuit 25 to a target delay (delay of 90°) under both the MAX condition and the MIN condition. Likewise, when the bit rate is 400 Mbps, 333 Mbps, and 266 Mbps, the offset setting value (OFFSET) can be 1, 2, and 3, respectively, to thereby set the delay amount of the whole DQS delay circuit 25 to a target delay (delay of 90°) under both the MAX condition and the MIN condition.

The lower limit of the range in which the target delay is set is provided when the assumed delay amount of each delay element DE is maximum (MAX condition) under the conditions that the delay amount of offset adjustment circuit 26 is minimum (the offset setting value (OFFSET)=0) and the delay amount of delay amount adjustment circuit 27 is minimum (the delay code is minimum). The upper limit of the range in which the target delay is set is provided when the assumed delay amount of each delay element DE is minimum (MIN condition) under the conditions that the delay amount of offset adjustment circuit 26 is maximum (the offset setting value (OFFSET)=3) and the delay amount of delay amount adjustment circuit 27 is maximum (the delay code is maximum).

Figure 12:
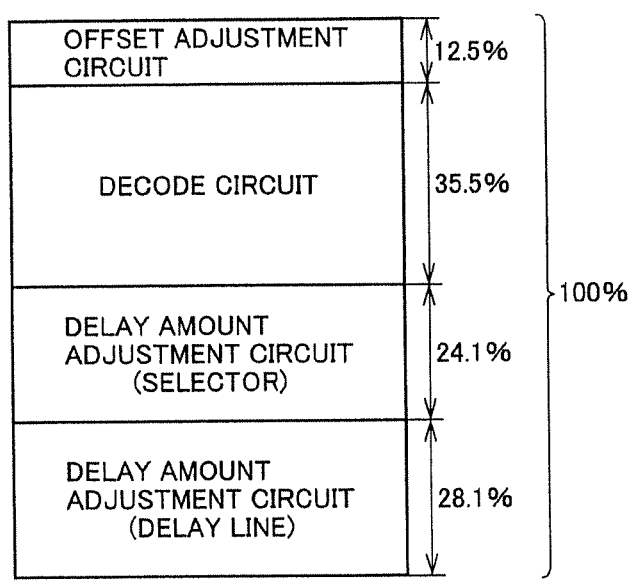
FIG. 12 is a diagram showing an example of the ratio of the area of each circuit which is a constituent element of DQS delay circuit 25.

FIG. 12 is a diagram showing an example of the ratio of the area of each circuit which is a constituent element of DQS delay circuit 25. FIG. 12 shows the ratio between the area of offset adjustment circuit 26 shown in FIG. 6, the area of delay line 60 which is a constituent element of delay amount adjustment circuit 27 in FIG. 5, the area of selector circuit 61 in FIG. 5, and the area of a decode circuit provided in control module 32 in FIG. 6. The decode circuit is provided for converting a binary code into delay code 41 to be input to selector circuit 61. As shown in FIG. 12, the area of offset adjustment circuit 26 is smaller than the areas of the other circuits. It is seen from this that an increase of the circuit area can be suppressed.

[Operation Sequence of Semiconductor Device 1]

Figure 13:
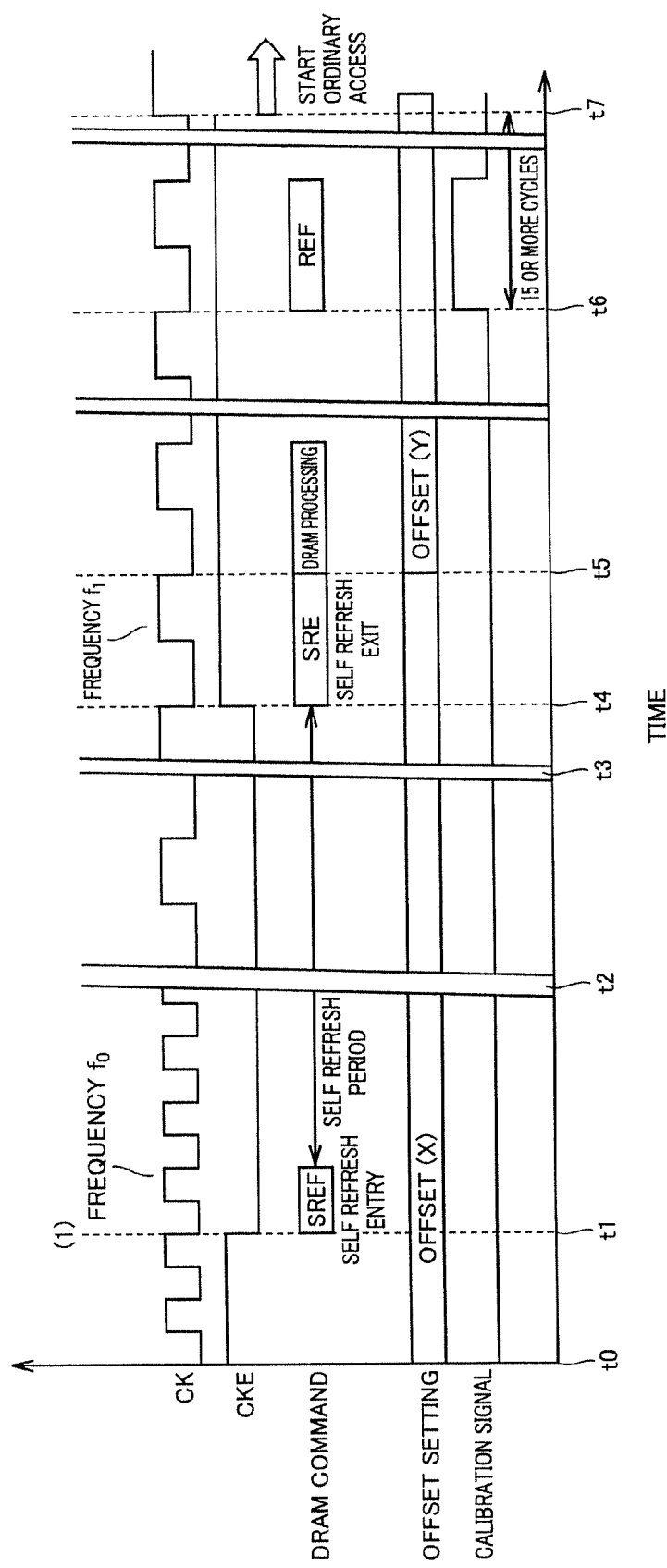
FIG. 13 a diagram showing an example operation sequence of semiconductor device 1 in FIG. 1.

FIG. 13 is a diagram showing an example operation sequence of semiconductor device 1 in FIG. 1. FIG. 13 shows the example where the operation frequency of the DRAM device is changed from $f_0$ to $f_1$.

Referring to FIGS. 1 and 13, the set frequency of system clock CK is $f_0$ in an initial state (time t0). It is supposed that the offset setting value (OFFSET) corresponding to this set frequency $f_0$ is X.

At time t1, memory controller 4 issues a self refresh entry (SREF) command. Accordingly, a self refresh period is started. Simultaneously, clock enable signal CKE is negated.

In the subsequent period t2, CPU 3 changes the set frequency of system clock CK. Since clock enable signal CKE has been negated, stoppage of system clock CK during change of the frequency causes no problem. The next period t3 is a standby period which lasts until the frequency of system clock CK becomes stable at At subsequent time t4, memory controller 4 issues a self refresh exit (SRE) command. Accordingly, the self refresh period is ended. Simultaneously, clock enable signal CKE is asserted.

At the next time t5, memory controller 4 changes the offset setting value to a value (Y) corresponding to set frequency $f_1$. Memory controller 4 further issues a processing command (such as precharge command for example) which can be executed by DRAM device 2 at this time.

At the next time t6, memory controller 4 issues an auto refresh (REF) command. Further, memory controller 4 asserts a calibration signal and accordingly the operation state of interface circuit 5 is changed to the calibration mode. Calibration control circuit 31 in FIG. 6 performs calibration of delay amount adjustment circuit 27 provided in DQS delay circuit 25 in FIG. 6, based on the offset setting value (Y) which has been changed. The calibration of delay amount adjustment circuit 27 takes 15 or more cycles.

At or after time t7 at which refresh of DRAM device 2 and calibration of delay amount adjustment circuit 27 are ended, ordinary DRAM access is started.

SUMMARY

As seen from the foregoing, semiconductor device 1 in the first embodiment provides DQS delay circuit 25 including offset adjustment circuit 26 which is capable of adjusting the delay amount in accordance with the offset setting value, as shown in FIGS. 2 and 6. Accordingly, without extension of the delay line provided in delay amount adjustment circuit 27, the maximum operation frequency can be increased and the range of frequency which can be accommodated can be expanded.

Further, the delay amount of the unit delay element which is a constituent element of the delay line provided in delay amount adjustment circuit 27 can be designed to be relatively small to thereby reduce a delay error relative to a target delay. When calibration is performed, the delay elements each having a relatively small delay amount that are provided in delay amount adjustment circuit 27 can be used to adjust the delay amount with high precision.

The delay amount (the number of delay elements DE) of each block in offset adjustment circuit 26 is determined in consideration of variation of the delay amount of unit delay element DE caused by variation of the manufacturing conditions, the operation temperature, and the operation voltage. It is therefore unnecessary to increase the number of delay elements provided in delay amount adjustment circuit 27.

Further, the threshold voltage of an MOS transistor forming each delay element DE provided in offset adjustment circuit 26 is set higher than the threshold voltage of an MOS transistor forming each delay element provided in delay amount adjustment circuit 27. Accordingly, the delay amount of each delay element DE provided in offset adjustment circuit 26 can be made larger than the delay amount of each delay element in the delay amount adjustment circuit. Thus, an increase of the circuit area due to newly provided offset adjustment circuit 26 can be suppressed.

Second Embodiment

Figure 14:
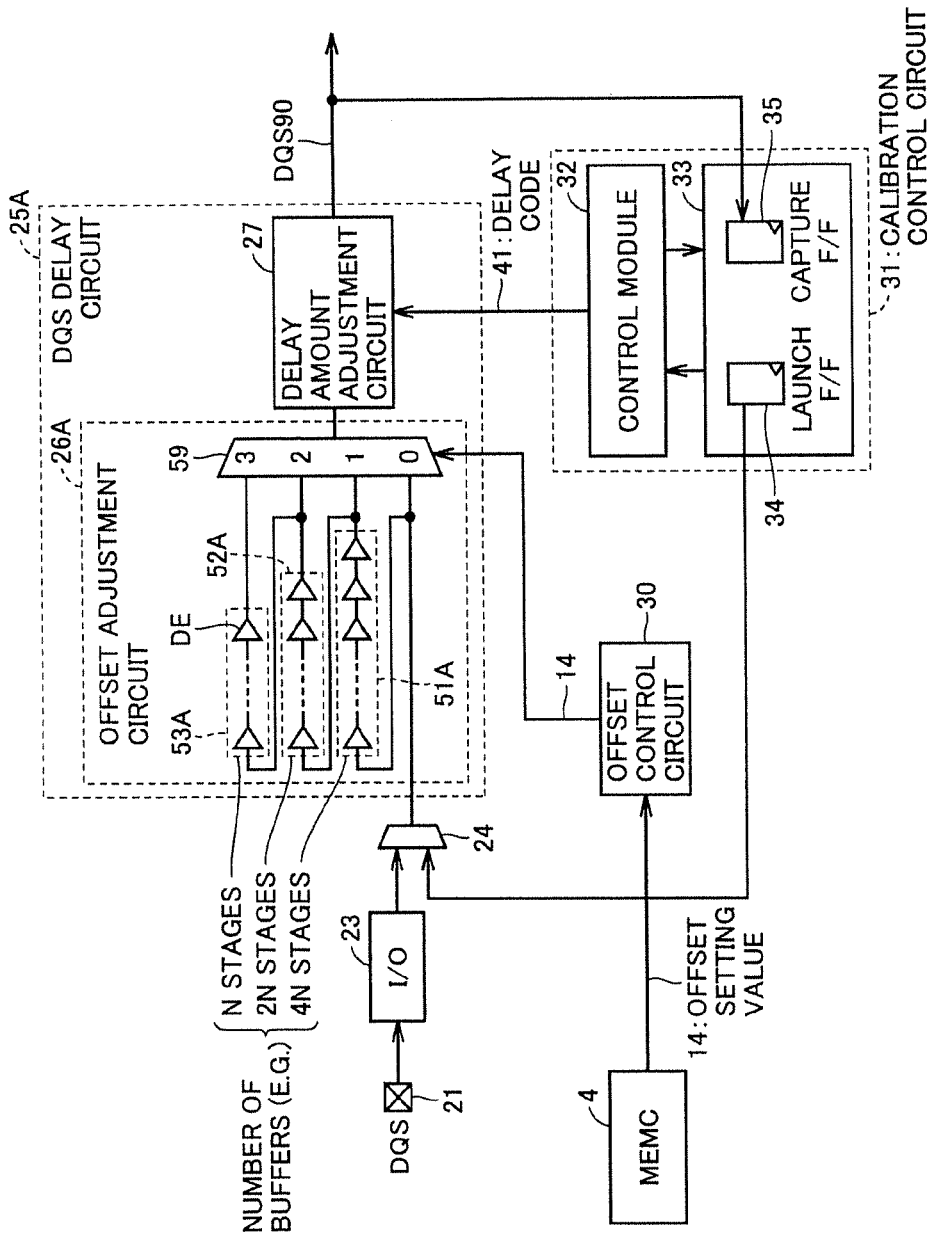
FIG. 14 is a diagram showing a configuration of a DQS delay circuit 25A provided in a semiconductor device according to a second embodiment of the present invention.

FIG. 14 is a diagram showing a configuration of a DQS delay circuit 25A provided in a semiconductor device according to a second embodiment of the present invention.

DQS delay circuit 25A in FIG. 14 differs from DQS delay circuit 25 in FIG. 6 in terms of the configuration of an offset adjustment circuit 26A. In offset adjustment circuit 26 in FIG. 6, respective numbers of delay elements provided in blocks 50 to 53 are equal to each other. In contrast, in offset adjustment circuit 26A in FIG. 14, respective numbers of delay elements provided in blocks 51A, 52A, 53A and constitute the delay line differ from each other.

Specifically, blocks 51A, 52A, 53A in FIG. 14 correspond to blocks 51, 52, 53 in FIG. 6, respectively. For example, block 51A is provided with N stages of delay elements DE, block 52A is provided with 2N stages of delay elements DE, and block 53A is provided with 4N stages of delay elements DE. As will be detailed later herein, respective numbers of delay elements constituting the blocks can be made different from each other to expand the range in which the operation frequency is set, as compared with the case of the first embodiment.

In offset adjustment circuit 26A in FIG. 14, a block corresponding to block 50 in FIG. 6 is not provided. When the offset setting value is 0 in FIG. 14, strobe signal DQS is input to delay amount adjustment circuit 27 without passing through delay elements DE. In this case, the delay amount of the whole DQS delay circuit 25A is adjusted by delay amount adjustment circuit 27. Other features in FIG. 14 are identical to those in FIG. 6. Therefore, the same or corresponding parts are denoted by the same reference characters, and the description thereof will not be repeated.

FIG. 15 is a diagram showing an example conversion table stored in memory controller 4 for offset adjustment circuit 26A in FIG. 14. In the example in FIG. 15, the offset setting value is defined in connection with the bit rate (equal to operation frequency f of the DRAM device) approximately from 200 Mbps to 800 Mbps. The range in which the operation frequency is set is expanded relative to the case in FIG. 7.

Figure 16:
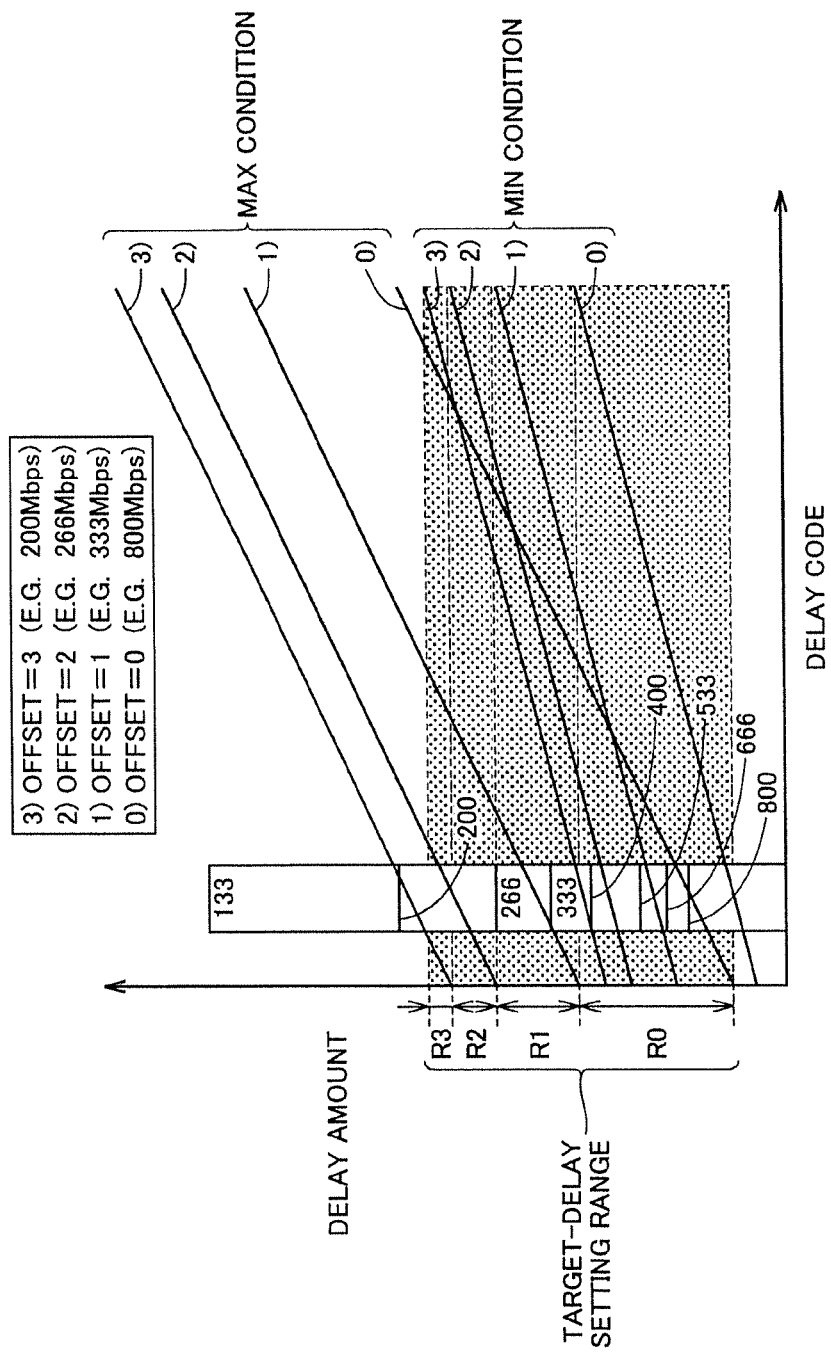
FIG. 16 is a diagram showing a relationship between the delay code and the delay amount of DQS delay circuit 25A in FIG. 14.

FIG. 16 is a diagram showing a relationship between the delay code and the delay amount of DQS delay circuit 25A in FIG. 14. Referring to FIG. 16, when the manufacturing conditions, the operation temperature, and the operation voltage of the semiconductor device vary, the condition that the assumed delay amount of each delay element DE is maximum is herein referred to as MAX condition while the condition that the assumed delay amount of each delay element DE is minimum is herein referred to as MIN condition. Supposing that the ranges in which the target delay is set when the offset setting value (OFFSET) is 0 to 3 are R0 to R3, respectively, the target-delay setting ranges R0 to R3 are successive without overlapping each other.

In order to allow the target-delay setting ranges R0 to R3 to be successive without overlapping each other as described above, the delay amount of the whole delay circuit when the MIN condition is met, the offset setting value is 0, and the delay amount of delay amount adjustment circuit 27 is maximum (the delay amount: upper limit of target-delay setting range R0) is made identical to the delay amount of the whole delay circuit when the MAX condition is met, the offset setting value is 1, and the delay amount of delay amount adjustment circuit 27 is minimum (the delay amount: lower limit of target-delay setting range R1). Likewise, the delay amount of the whole delay circuit when the MIN condition is met, the offset setting value is 1, and the delay amount of delay amount adjustment circuit 27 is maximum (the delay amount: upper limit of target-delay setting range R1) is made identical to the delay amount of the whole delay circuit when the MAX condition is met, the offset setting value is 2, and the delay amount of delay amount adjustment circuit 27 is minimum (the delay amount: lower limit of target-delay setting range R2). Further, the delay amount of the whole delay circuit when MIN condition is met, the offset setting value is 2, and the delay amount of delay amount adjustment circuit 27 is maximum (the delay amount: upper limit of target-delay setting range R2) is made identical to the delay amount of the whole delay circuit when the MAX condition is met, the offset setting value is 3, and the delay amount of delay amount adjustment circuit 27 is minimum (the delay amount: lower limit of target-delay setting range R3).

A more general description of the above is as follows. It is supposed that a plurality of series-connected delay elements DE provided in offset adjustment circuit 26 are divided into M blocks from first to M-th blocks. It is further supposed that an integer of 1 or more and M or less is represented by i. In accordance with the offset setting value, selector circuit 59 outputs strobe signal DQS which has passed through none of the M blocks or passed through i blocks from the first block to the i-th block in order among M blocks. Here, it is supposed that an integer of 1 or more and M−1 or less is represented by j. Then, the maximum value of the delay amount which can be set by the delay circuit as a whole when the signal having passed through j blocks from first to j-th blocks is output from offset adjustment circuit 26 and the MIN condition is met, is equal to or larger than the minimum value of the delay amount which can be set by the delay circuit as a whole when the signal having passed through j+1 blocks from first to j+1-th blocks is output from offset adjustment circuit 26 and the MAX condition is met. When the former is equal to the latter, the target-delay setting ranges corresponding respectively to the offset setting values are successive without overlapping each other. When the former is larger than the latter, the target-delay setting ranges corresponding respectively to the offset setting values overlap each other.

In this way, target-delay setting ranges R0 to R3 corresponding respectively to the offset setting values are defined so that they do not overlap each other. Accordingly, the target-delay setting range of DQS delay circuit 25A as a whole can be expanded relative to that in the first embodiment. Other effects of the second embodiment are similar to those of the first embodiment. For example, the delay amount of unit delay element DE provided in delay amount adjustment circuit 27 can be set relatively small to thereby achieve the effect of reducing the delay error. In the following, the target-delay setting range will further be described with reference to FIGS. 17 and 18.

Figure 17A:
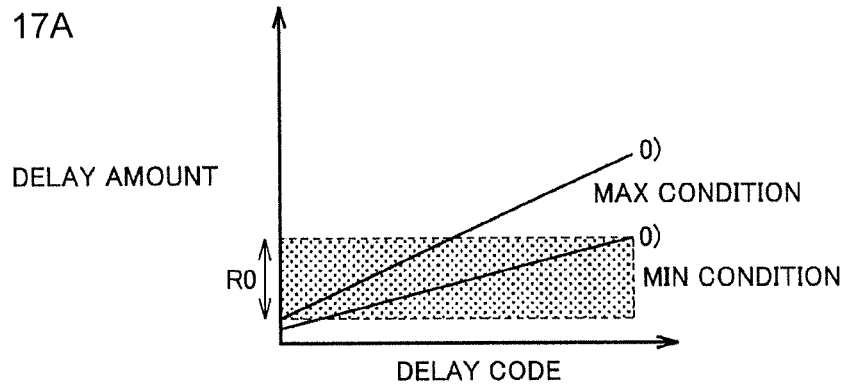
FIGS. 17A-17C are diagrams for illustrating a procedure of determining the number of stages of delay elements provided in each delay line.
Figure 17B:
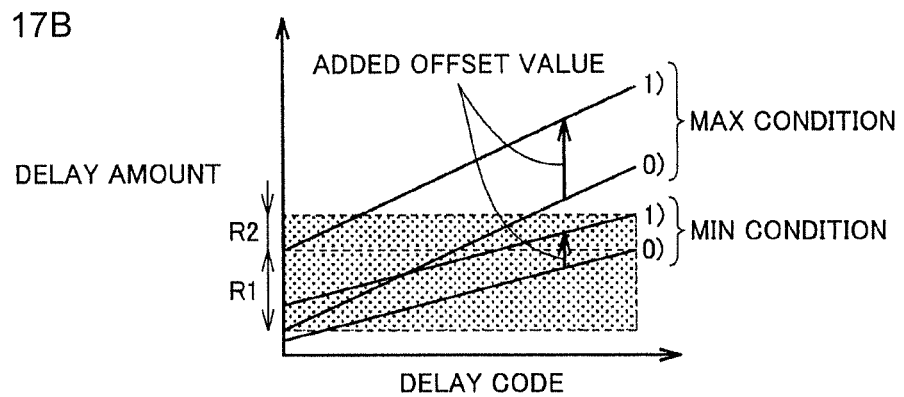
Figure 17C:
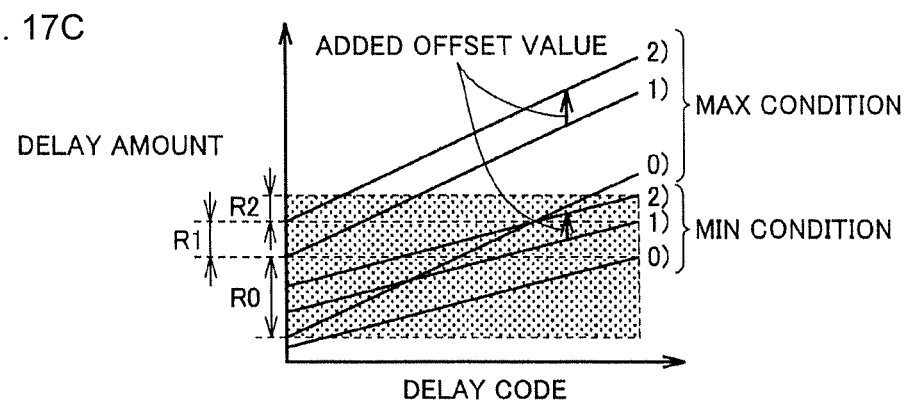

FIGS. 17A-17C is a diagram for illustrating a procedure of determining the number of stages of delay elements provided in each delay line.

Referring to FIG. 17A, the delay characteristic (relationship between the delay amount and the delay code of the whole DQS delay circuit) in the case where the offset setting value is 0 is first plotted to confirm target-delay setting range R0. The upper limit of target-delay setting range R0 is obtained when the MIN condition is met and the delay code is maximum.

Referring next to FIG. 17B, the delay amount (the number of delay elements) of block 51A in FIG. 14 is determined so that the upper limit of target-delay setting range R0 is equal to the delay amount obtained under the conditions that the offset setting value is 1, the MAX condition is met, and the delay code is minimum. In accordance with the delay amount (the number of delay elements) of block 51A, an added offset value in FIG. 17B is determined. The delay amount of block 51A is thus determined and accordingly target-delay setting range R0 in the case where the offset setting value is 0 and target-delay setting range R1 in the case where the offset setting value is 1 do not overlap each other and respective boundaries of these ranges R0 and R1 coincide with each other.

Referring next to FIG. 17C, the delay amount (the number of delay elements) of block 52A in FIG. 14 is determined so that the upper limit of target-delay setting range R1 is equal to the delay amount obtained under the conditions that the offset setting value is 2, the MAX condition is met, and the delay code is minimum. In accordance with the delay amount (the number of delay elements) of block 52A, an added offset value in FIG. 17C is determined. The above process can be repeated to expand the target-delay setting range of the whole DQS delay circuit.

The added offset value in FIG. 17C is smaller than the added offset value in FIG. 17B. In other words, the delay amount (the number of delay elements) of block 52A is smaller than the delay amount (the number of delay elements) of block 51A in FIG. 14. This relationship may more generally be described as follows.

It is supposed that a plurality of series-connected delay elements DE provided in offset adjustment circuit 26A are divided into M blocks from first to M-th blocks. It is further supposed that an integer of 1 or more and M or less is represented by i. Then, in accordance with the offset setting value, selector circuit 59 outputs strobe signal DQS which has passed through none of the M blocks or passed through i blocks from the first block to the i-th block in order among the M blocks. Here, it is supposed that an integer of 1 or more and M−1 or less is represented by j. Then, the number of delay elements included in the j-th block is larger than the number of delay elements included in the j+1-th block.

Figure 18A:
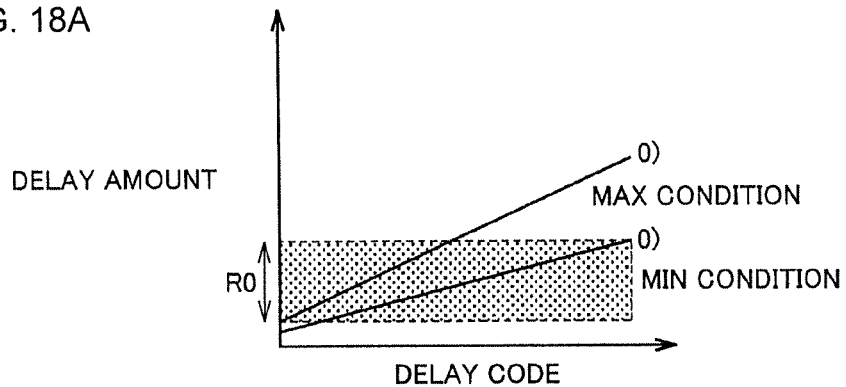
FIGS. 18A-18C are diagrams of a comparative example relative to FIGS. 17A-17C, for illustrating a case where the number of stages of delay elements provided in each delay line is inappropriate.
Figure 18B:
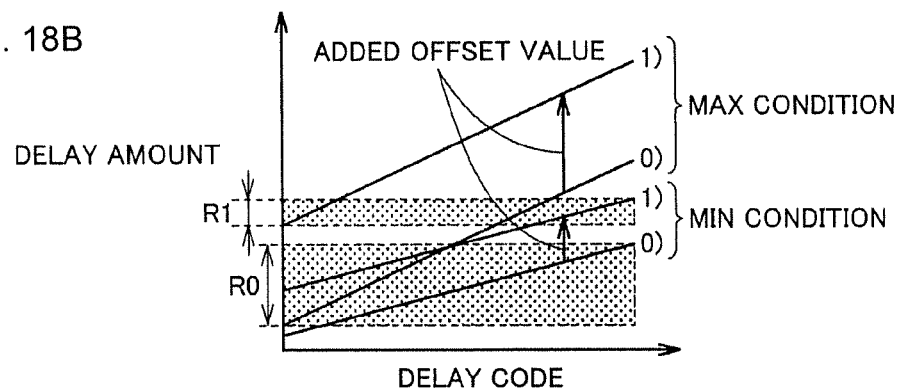
Figure 18C:
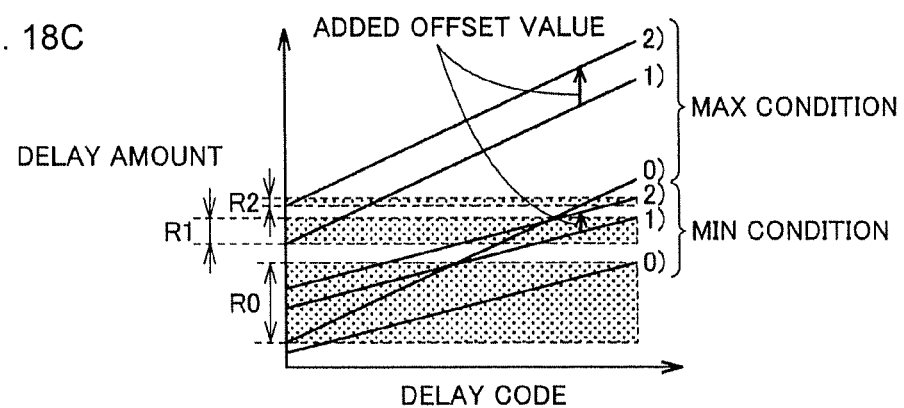

FIGS. 18A-18C are diagrams of a comparative example relative to FIGS. 17A-17C, for illustrating a case where the number of stages of delay elements provided in each delay line is inappropriate. FIG. 18A is identical to FIG. 17A. The upper limit of target-delay setting range R0 is obtained when the MIN condition is met and the delay code is maximum.

Referring to FIG. 18B, if the delay amount under the conditions that the offset setting value is 1, the MAX condition is met, and the delay code is minimum (the delay amount: lower limit of target-delay setting range R1) is larger than the upper limit of target-delay setting range R0, there arises a gap between target-delay setting range R0 and target-delay setting range R1. In the range corresponding to the gap, the delay amount cannot be set. As compared with FIG. 17B, the delay amount (the number of delay elements) of block 51A is set larger in FIG. 18B. Therefore, the added offset value is too large, resulting in the gap between ranges R0 and R1.

Referring to FIG. 18C, if the delay amount under the conditions that the offset setting value is 2, the MAX condition is met, and the delay code is minimum (the delay amount: lower limit of target-delay setting range R2) is larger than the upper limit of target-delay setting range R1, there also arises a gap between target-delay setting range R1 and target-delay setting range R2. As compared with FIG. 17C, the delay amount (the number of delay elements) of block 52A is set larger in FIG. 18C. Therefore, the added offset value is too large, resulting in the gap between ranges R1 and R2.

Third Embodiment

Interface circuit 5 in a third embodiment further has a test mode as an operation mode. In the test mode, the delay amount of the DQS delay circuit is made smaller than the delay amount (90°) in the normal mode so that a setup margin test can be performed. The normal mode and the test mode are switched to each other by means of a bypass enable signal (BYPASS-EN). In the following, a more specific description will be given with reference to FIGS. 19 and 20.

Figure 19:
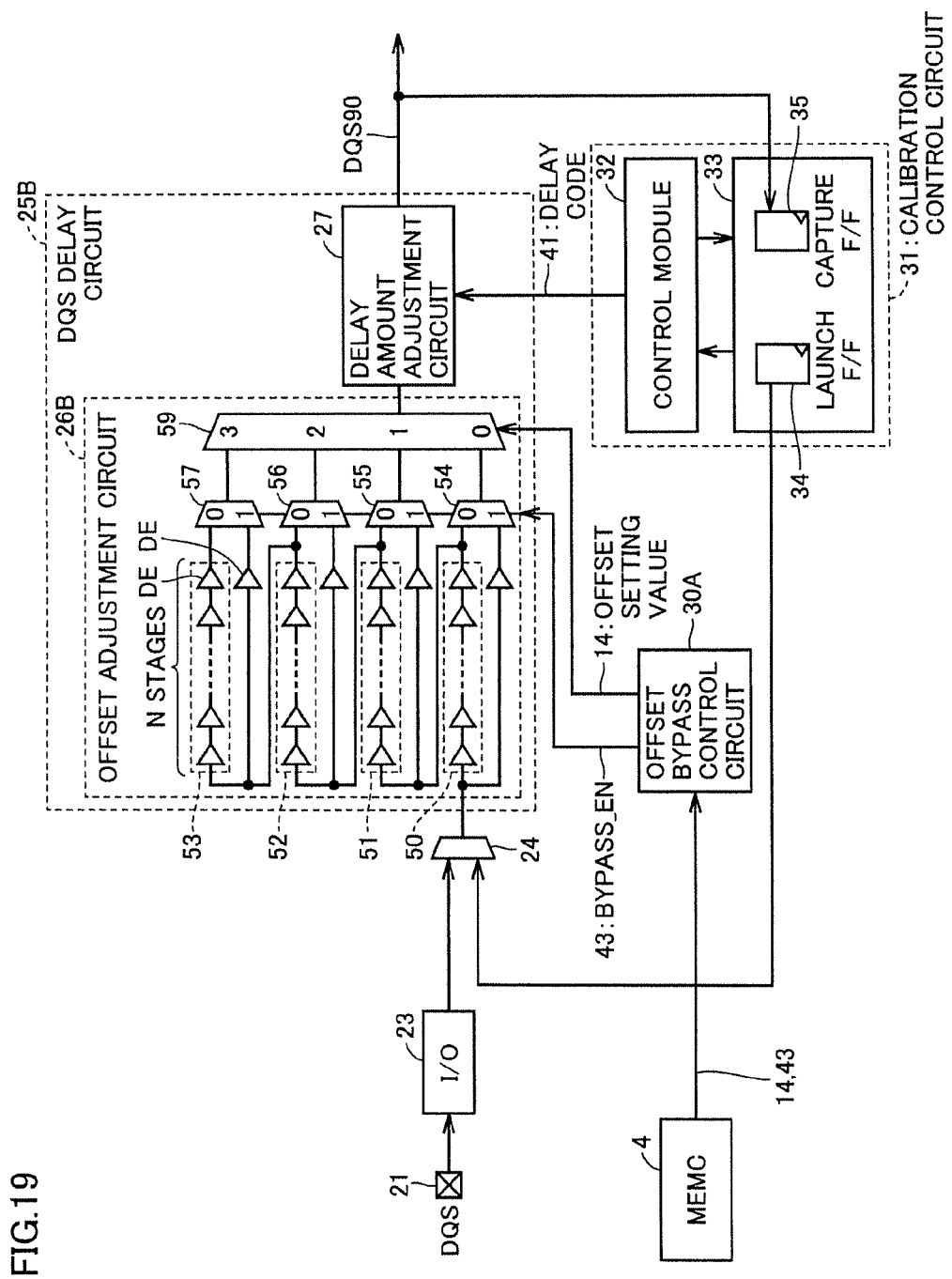
FIG. 19 is a diagram showing a configuration of a DQS delay circuit 25B provided in a semiconductor device according to a third embodiment of the present invention.

FIG. 19 is a diagram showing a configuration of a DQS delay circuit 25B provided in a semiconductor device according to the third embodiment of the present invention. In an offset adjustment circuit 26B of DQS delay circuit 25B in FIG. 19, one or a plurality of bypass lines are provided for the test mode. Each bypass line is provided in parallel with a part of a delay line which is used in the normal mode. The delay amount of the bypass line is determined based on the characteristic of the whole DQS delay circuit 25B.

Specifically, in the case of offset adjustment circuit 26B in FIG. 19, the bypass lines are provided in parallel with blocks 50 to 53, respectively, which are described above in connection with FIG. 6. Each bypass line includes only one delay element DE, and therefore the delay amount of the bypass line is smaller than the delay amount of its associated block connected in parallel with the bypass line.

Offset adjustment circuit 26B further includes selector circuits 54 to 57. When a bypass enable signal 43 is activated to indicate H level ("1"), selector circuit 54 outputs to selector circuit 59 a signal which has passed through the associated bypass line, instead of a signal having passed through block 50. Likewise, when bypass enable signal 43 is being activated, selector circuit 55 outputs to selector circuit 59 a signal having passed through the associated bypass line, instead of a signal having passed through block 51. When bypass enable signal 43 is being activated, selector circuit 56 outputs to selector circuit 59 a signal having passed through the associated bypass line, instead of a signal having passed through block 52. When bypass enable signal 43 is being activated, selector circuit 57 outputs to selector circuit 59 a signal having passed through the associated bypass line, instead of a signal having passed through block 53.

DQS delay circuit 25A in FIG. 19 further includes an offset bypass control circuit 30A instead of offset control circuit 30 in FIG. 6. Offset bypass control circuit 30A outputs the aforementioned bypass enable signal 43 as well as the offset setting value 14 described above, under control by memory controller 4.

In the above-described configuration, when the offset setting value is 0 and bypass enable signal 43 is being activated, strobe signal DQS which has passed through the bypass line connected in parallel with block 50 is fed to delay amount adjustment circuit 27 located in the subsequent stage. When the offset setting value is 1 and bypass enable signal 43 is being activated, strobe signal DQS which has passed through the bypass lines connected in parallel with block 50 and block 51 is fed to delay amount adjustment circuit 27 located in the subsequent stage. Likewise, when the offset setting value is 2 and bypass enable signal 43 is being activated, strobe signal DQS having passed through the bypass lines connected in parallel with blocks 50, 51, and 52 is fed to delay amount adjustment circuit 27 located in the subsequent stage. When the offset setting value is 3 and bypass enable signal 43 is being activated, strobe signal DQS having passed through the bypass lines connected in parallel with blocks 50 to 52 and block 53 is fed to delay amount adjustment circuit 27 located in the subsequent stage.

Figure 20:
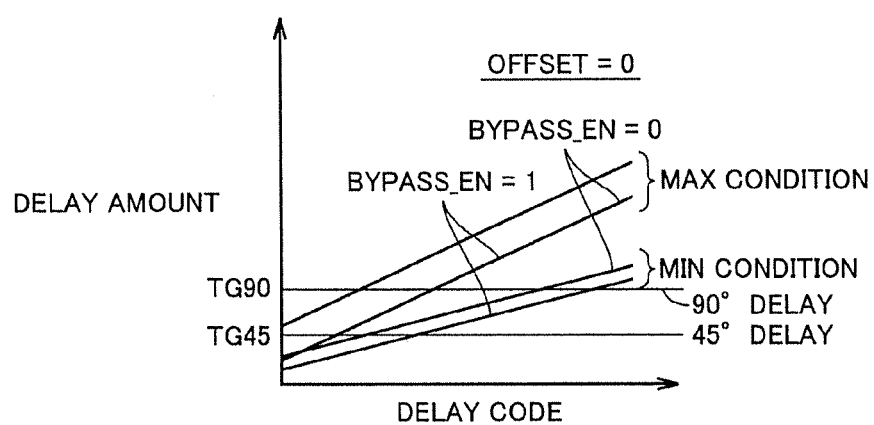
FIG. 20 is a diagram showing, regarding DQS delay circuit 25B in FIG. 19, a relationship between the delay code and the delay amount of the whole delay circuit when the offset value is 0.

FIG. 20 is a diagram showing, regarding DQS delay circuit 25B in FIG. 19, a relationship between the delay code and the delay amount of the whole delay circuit when the offset value is 0.

Referring to FIG. 20, a description will be given of a case where a setup margin test is performed with a delay amount TG45 of 45 degrees, instead of delay amount TG90 of 90 degrees in the normal mode. In this case, the delay amount of each bypass line is set in advance so that the delay amount is approximately 45 degrees.

When the bypass enable signal is activated, the line representing the relationship between the delay amount and delay code 41 of DQS delay circuit 25B shifts downward with its slope maintained. Accordingly the state of 45-degree delay can be generated which cannot be generated in the normal mode even when the delay code is set to a minimum value, and accordingly the setup margin test can be performed.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 semiconductor device; 2 DRAM device; 4 memory controller; 4A conversion table; 5 interface circuit; 7 clock generator; 14 offset setting value; 24 selector circuit; 25, 25A, 25B DQS delay circuit; 26, 26A, 26B offset adjustment circuit; 27 delay amount adjustment circuit; 28 data detection circuit; 30 offset control circuit; 30A offset bypass control circuit; 31 calibration control circuit; 32 control module; 33 signal processing unit; 34 pulse generator; 35 phase comparator; 41 delay code; 43 bypass enable signal; 50 to 53, 51A to 53A block; 60 delay line; 59, 61 selector circuit; CK system clock; DE delay element; DQ data signal; DQS strobe signal

The invention claimed is:

1. A semiconductor device comprising an interface circuit, the interface circuit comprising:
   a buffer configured to receive a data signal and a strobe signal from an external memory device;
   a delay circuit configured to delay the received strobe signal; and
   a data detection circuit configured to sample the data signal at a timing of an edge of the strobe signal having been delayed by the delay circuit,
   the delay circuit comprising:
      a first adjustment circuit including a plurality of delay elements and configured to adjust a delay amount of the strobe signal in a plurality of steps; and
      a second adjustment circuit connected in series with the first adjustment circuit and capable of adjusting the delay amount of the strobe signal with a higher precision than the first adjustment circuit,
      the first adjustment circuit further comprising:
         a bypass line connected in parallel with a part of the plurality of delay elements and having a delay amount smaller than a delay amount of the part of the delay elements as a whole with which the bypass line is connected in parallel; and
         a selector configured to select and output the strobe signal passing through the part of the plurality of delay elements or the strobe signal passing through the bypass line connected in parallel with the part of the plurality of delay elements, wherein
      the plurality of delay elements provided in the first adjustment circuit are connected in series with each other, and divided into M blocks from first to M-th blocks each including a plurality of delay elements,
      the bypass line is connected in parallel with each of the M blocks,
      the selector is provided for each of the M blocks, and configured to select the strobe signal passing through an associated i-th block of the M blocks ($1 \leq i \leq M$) or the strobe signal passing through the bypass line connected in parallel with the i-th M block, and
   the semiconductor device further comprises a clock generator configured to generate a clock signal having a set frequency,
   the interface circuit is configured to supply an operation clock to the external memory device based on the clock signal, and
   the first adjustment circuit further comprises a selection circuit configured to select, in accordance with the set frequency of the clock signal, one of outputs of the selectors which are associated with the respective M blocks.

2. The semiconductor device according to claim 1, further comprising:
   a central processing unit configured to set the frequency of the clock signal; and
   a control circuit configured to output a delay-amount setting value corresponding to the set frequency of the clock signal, wherein
   the selection circuit is configured to select, based on the delay-amount setting value, one of outputs of the selectors which are associated with the respective M blocks.

3. The semiconductor device according to claim 2, wherein
   the control circuit is configured to determine the delay-amount setting value so that a number of delay elements through which the strobe signal passes is larger as the set frequency is lower.

4. A semiconductor device comprising an interface circuit, the interface circuit comprising:
   a buffer configured to receive a data signal and a strobe signal from an external memory device;
   a delay circuit configured to delay the received strobe signal; and
   a data detection circuit configured to sample the data signal at a timing of an edge of the strobe signal having been delayed by the delay circuit,
   the delay circuit comprising:
      a first adjustment circuit including a plurality of delay elements and configured to adjust a delay amount of the strobe signal in a plurality of steps; and
      a second adjustment circuit connected in series with the first adjustment circuit and capable of adjusting the delay amount of the strobe signal with a higher precision than the first adjustment circuit, and
      the first adjustment circuit further comprising:
         a bypass line connected in parallel with a part of the plurality of delay elements and having a delay amount smaller than a delay amount of the part of the delay elements as a whole with which the bypass line is connected in parallel; and
         a selector configured to select and output the strobe signal passing through the part of the plurality of delay elements or the strobe signal passing through the bypass line connected in parallel with the part of the plurality of delay elements, wherein
      the plurality of delay elements provided in the first adjustment circuit are connected in series with each other, and divided into M blocks from first to M-th blocks each including a plurality of delay elements,
      the bypass line is connected in parallel with at least one of the M blocks,
      the selector is provided for the bypass line, and configured to select the strobe signal passing through the at least one of the M blocks or the strobe signal passing through the bypass line connected in parallel with the at least one of the M blocks, and
   the semiconductor device further comprises a clock generator configured to generate a clock signal having a set frequency, the interface circuit is configured to supply an operation clock to the external memory device based on the clock signal, and the first adjustment circuit further comprises a selection circuit configured to select, in accordance with the set frequency of the clock signal, one of outputs of the selectors which are associated with the part of the M blocks.

\* \* \* \* \*